(12) United States Patent
Yokoyama et al.

(10) Patent No.: US 12,099,026 B2
(45) Date of Patent: Sep. 24, 2024

(54) THERMAL CONDUCTIVITY ESTIMATION METHOD, THERMAL CONDUCTIVITY ESTIMATION APPARATUS, PRODUCTION METHOD FOR SEMICONDUCTOR CRYSTAL PRODUCT, THERMAL CONDUCTIVITY CALCULATOR, THERMAL CONDUCTIVITY CALCULATION PROGRAM, AND, THERMAL CONDUCTIVITY CALCULATION METHOD

(71) Applicant: SUMCO CORPORATION, Tokyo (JP)

(72) Inventors: Ryusuke Yokoyama, Tokyo (JP); Toshiyuki Fujiwara, Tokyo (JP); Yusuke Higuchi, Aichi (JP); Toru Ujihara, Aichi (JP)

(73) Assignee: SUMCO CORPORATION, Tokyo (JP)

( * ) Notice: Subject to any disclaimer, the term of this patent is extended or adjusted under 35 U.S.C. 154(b) by 683 days.

(21) Appl. No.: 17/297,080

(22) PCT Filed: Nov. 18, 2019

(86) PCT No.: PCT/JP2019/045041
§ 371 (c)(1),
(2) Date: May 26, 2021

(87) PCT Pub. No.: WO2020/110796
PCT Pub. Date: Jun. 4, 2020

(65) Prior Publication Data
US 2022/0034829 A1  Feb. 3, 2022

(30) Foreign Application Priority Data

Nov. 28, 2018 (JP) ................................ 2018-222618

(51) Int. Cl.
*G01N 25/18*   (2006.01)
*C30B 15/20*   (2006.01)
(Continued)

(52) U.S. Cl.
CPC ............. *G01N 25/18* (2013.01); *C30B 15/20* (2013.01); *C30B 35/00* (2013.01); *G01N 27/18* (2013.01); *G06N 20/00* (2019.01); *C30B 29/36* (2013.01)

(58) Field of Classification Search
None
See application file for complete search history.

(56) References Cited

U.S. PATENT DOCUMENTS 5,038,304 A * 8/1991 Bonne .................... G01N 25/18
702/100
2007/0244676 A1* 10/2007 Shang ..................... G06F 30/23
703/2

FOREIGN PATENT DOCUMENTS

CN    101512750 A    8/2009
CN    102879130 A    1/2013
(Continued)

OTHER PUBLICATIONS

Office Action for CN App. No. 201980078556.3, dated Sep. 30, 2023 (w/ translation).
(Continued)

*Primary Examiner* — Erica S Lin
(74) *Attorney, Agent, or Firm* — Greenblum & Bernstein, P.L.C.

(57) ABSTRACT

A thermal conductivity estimation method includes: measuring temperature distribution of a measurement sample surface in a steady state by partially heating the measurement sample under predetermined heating conditions; calculating temperature distribution of a sample model surface by performing a heat-transfer simulation on the sample model of the same shape as the measurement sample for a plurality of combinations of provisional thermal conductivities and heating conditions; making a regression model, whose input is temperature distribution of the measurement (Continued)

sample surface and whose output is a thermal conductivity of the measurement sample, by a machine learning technique using training data in a form of a calculation result of the plurality of combinations and the temperature distribution obtained from the plurality of combinations; and estimating the thermal conductivity of the measurement sample by inputting a measurement result of the temperature distribution of the measurement sample surface into the regression model.

15 Claims, 6 Drawing Sheets

(51) Int. Cl.
  *C30B 35/00* (2006.01)
  *G01N 27/18* (2006.01)
  *G06N 20/00* (2019.01)
  *C30B 29/36* (2006.01)

(56) References Cited

FOREIGN PATENT DOCUMENTS

| | | |
|---|---|---|
| CN | 103192048 A | 7/2013 |
| CN | 104535609 A | 4/2015 |
| CN | 105572161 A | 5/2016 |
| CN | 106226351 A | 12/2016 |
| CN | 107024503 A | 8/2017 |
| JP | 8-211946 | 8/1996 |
| JP | 2000-52225 | 2/2000 |
| JP | 2006-64413 | 3/2006 |
| JP | 2007-283435 | 11/2007 |
| JP | 2010-34337 | 2/2010 |
| JP | 2010-037114 A | 2/2010 |
| JP | 2010-275170 | 12/2010 |
| JP | 2011-106918 A | 6/2011 |
| JP | 2018-43890 | 3/2018 |
| JP | 2018-169818 | 11/2018 |
| TW | 200617377 A | 6/2006 |
| TW | 201243954 A | 11/2012 |

OTHER PUBLICATIONS

Office Action for KR App. No. 10-2021-7016789, dated Jun. 1, 2022 (w/ translation).

IPRP for PCT/JP2019/045041, dated May 25, 2021.

Zhang, L. et al., "Inverse identification of interfacial heat transfer coefficient between the casting and metal mold using neural network", Energy Conversion and Management, vol. 51, issue 10, pp. 1898-1904, Mar. 19, 2010.

Official Communication issued in International Bureau of WIPO Patent Application No. PCT/JP2019/045041, dated Dec. 24, 2019.

* cited by examiner l LAYER    m LAYER    m LAYER    n LAYER

THERMAL CONDUCTIVITY ESTIMATION METHOD, THERMAL CONDUCTIVITY ESTIMATION APPARATUS, PRODUCTION METHOD FOR SEMICONDUCTOR CRYSTAL PRODUCT, THERMAL CONDUCTIVITY CALCULATOR, THERMAL CONDUCTIVITY CALCULATION PROGRAM, AND, THERMAL CONDUCTIVITY CALCULATION METHOD

TECHNICAL FIELD

The present invention relates to a thermal conductivity estimation method, a thermal conductivity estimation apparatus, a production method of a semiconductor crystal product, a thermal conductivity calculator, a thermal conductivity calculation program, and a thermal conductivity calculation method.

BACKGROUND ART

An example of typically known heat-transfer simulation techniques related to growth of monocrystalline semiconductor, especially monocrystalline silicon, is disclosed in Patent Literature 1.

According to the method disclosed in Patent Literature 1, a heat-transfer analysis program, which is optimized using actual measurements in growing a small-diameter crystal, is used after heat parameters in a crystal growth unit are modified to be adjusted to properties of a large-diameter monocrystal during growth thereof, thereby estimating a crystal temperature distribution in growing the large-diameter crystal.

Other examples of known techniques for producing semiconductor crystal products such as a semiconductor monocrystal and a semiconductor board are disclosed in Patent Literatures 2 to 5.

CITATION LIST

Patent Literature(s)

Patent Literature 1: JP 2010-275170 A
Patent Literature 2: JP 2018-43890 A
Patent Literature 3: JP 2000-52225 A
Patent Literature 4 JP 2007-283435 A
Patent Literature 5 JP 2010-34337 A

SUMMARY OF THE INVENTION

Problems to be Solved by the Invention

However, according to the method disclosed in Patent literature 1, the heat parameters (e.g. thermal conductivity and radiation factor) of interior components of an apparatus used for the heat-transfer simulation are estimated for modification based on the properties of the grown crystal. Accordingly, the heat-transfer simulation cannot be performed unless the crystal growth unit is actually present and the crystal can be grown. Further, because the interior components of the crystal growth unit experience temporal change after being subjected to a high temperature for a long time, the accuracy of the heat-transfer simulation is improvable only after multiple crystals are pulled up over time using a single crystal production apparatus.

In order to perform the heat-transfer simulation inside the crystal growth apparatus without actually growing the crys-tal, it is necessary to accurately measure the heat parameters of the material of the interior of the crystal growth apparatus. However, an apparatus having a special mechanism dedicated for specific measurement process is necessary to measure, among others, the thermal conductivity. In addition, the measurement cannot be easily performed because the sample has to be processed into a size, shape, and surface condition required for the respective measurement processes.

Meanwhile, it is expected that an appropriate heat-transfer simulation can be performed by optimizing the thermal conductivity of components used for production, which is a very important heat parameter during a production step of a semiconductor board, especially, a silicon wafer, as disclosed in Patent Literatures 2 to 5.

An object of the invention is to provide a thermal conductivity estimation method, a thermal conductivity estimation apparatus, a production method of a semiconductor crystal product, a thermal conductivity calculator, a thermal conductivity calculation program, and a thermal conductivity calculation method that are capable of easily estimating the thermal conductivity in performing various heat-transfer analyses for a production step of a semiconductor crystal product.

Means for Solving the Problems

A thermal conductivity estimation method according to an aspect of the invention includes: preparing, as a measurement sample, a component of a production apparatus for a semiconductor crystal product; heating a part of the measurement sample under a predetermined heating condition and measuring a temperature distribution of a surface of the measurement sample under a steady state; performing a heat-transfer simulation for a plurality of combinations of provisional thermal conductivities and heating conditions of a sample model of the same shape as the measurement sample to calculate a temperature distribution of the surface of the sample model for each of the plurality of combinations; making a regression model using a machine learning technique on a basis of training data, the training data being defined by the plurality of combinations used in the heat-transfer simulation and a calculation result of the temperature distribution obtained from the plurality of combinations, an input of the regression model comprising the temperature distribution of the surface of the measurement sample, an output of the regression model consist of the thermal conductivity of the measurement sample; and estimating the thermal conductivity of the measurement sample by inputting a result of the measurement of the temperature distribution of the surface of the measurement sample into the regression model.

A thermal conductivity estimation apparatus according to another aspect of the invention includes: a measurement unit configured to heat a part of a component, which is prepared as a measurement sample, of a production apparatus of a semiconductor crystal product under a predetermined heating condition and measure a temperature distribution of a surface of the measurement sample under a steady state; a calculation unit configured to perform a heat-transfer simulation for a plurality of combinations of provisional thermal conductivities and heating conditions of a sample model of the same shape as the measurement sample to calculate a temperature distribution of the surface of the sample model for each of the plurality of combinations; a machine learning unit configured to make a regression model using a machine learning technique on a basis of training data, the training data being defined by the plurality of combinations used in the heat-transfer simulation and a calculation result of the temperature distribution obtained from the plurality of combinations, an input of the regression model including the temperature distribution of the surface of the measurement sample, an output of the regression model including the thermal conductivity of the measurement sample; and an estimation unit configured to input a result of the measurement of the temperature distribution of the surface of the measurement sample into the regression model to estimate the thermal conductivity of the measurement sample.

According to the above aspects of the invention, the heat-transfer simulation is performed for a plurality of combinations of provisional thermal conductivities and heating conditions of the sample model, while the sample model is designed to have the same shape as the measurement sample, without specifying the material. Next, the regression model is made through the machine learning technique using the training data in a form of the result of the heat-transfer simulation. Subsequently, the measurement result of the temperature distribution of the surface of the measurement sample when a part of the measurement sample is heated is input to the regression model to estimate the thermal conductivity of the measurement sample.

Since the material of the sample model is thus not taken into consideration when the regression model is made, the thermal conductivity of various measurement samples of different materials can be easily estimated using the regression model. Consequently, the thermal conductivity can be easily estimated in analyzing various heat-transfer patterns during the production step of the semiconductor crystal product.

In the thermal conductivity estimation method according to the above aspect of the invention, it is preferable that, in making the regression model through the machine learning technique, the input of the regression model is defined by the temperature distribution of the surface of the measurement sample and a heating condition in measuring the temperature distribution, and in estimating the thermal conductivity, the result of the measurement of the temperature distribution and the heating condition in measuring the temperature distribution are inputted into the regression model to estimate the thermal conductivity of the measurement sample.

In the thermal conductivity estimation apparatus according to the above aspect of the invention, it is preferable that the input of the regression model made by the machine learning unit includes the temperature distribution of the surface of the measurement sample and a heating condition in measuring the temperature distribution, and the estimation unit is configured to input the result of the measurement of the temperature distribution and the heating condition in measuring the temperature distribution into the regression model to estimate the thermal conductivity of the measurement sample.

According to the above arrangement, an estimation accuracy of the thermal conductivity of the measurement sample is improvable.

In the thermal conductivity estimation method according to the above aspect of the invention, it is preferable that the heat-transfer simulation performed in calculating the temperature distribution of the surface of the sample model assumes the same measurement system as a measurement system used in measuring the temperature distribution.

In the thermal conductivity estimation apparatus according to the above aspect of the invention, it is preferable that the heat-transfer simulation performed by the calculation unit assumes the same measurement system as a measurement system used in measuring the temperature distribution of the surface of the measurement sample.

According to the above arrangement, in accordance with the improvement in the accuracy of the heat-transfer simulation, the accuracy of the regression model is improvable and, consequently, the estimation accuracy of the thermal conductivity of the measurement sample is improvable.

In the thermal conductivity estimation method according to the above aspect of the invention, it is preferable that the heat-transfer simulation performed in calculating the temperature distribution of the surface of the sample model assumes the same atmosphere as an atmosphere in measuring the temperature distribution of the surface of the measurement sample.

In the thermal conductivity estimation apparatus according to the above aspect of the invention, it is preferable that the heat-transfer simulation performed by the calculation unit assumes the same atmosphere as an atmosphere in measuring the temperature distribution of the surface of the measurement sample.

According to the above arrangement, in accordance with the improvement in the accuracy of the heat-transfer simulation, the accuracy of the regression model is improvable and, consequently, the estimation accuracy of the thermal conductivity of the measurement sample is improvable.

In the thermal conductivity estimation method according to the above aspect of the invention, the measurement sample is optionally a substitution material of the component.

According to the above arrangement, the measurement sample is readily available.

In the thermal conductivity estimation apparatus according to the above aspect of the invention, it is preferable that the measurement unit includes a measurement case that houses the measurement sample.

According to the above arrangement, the atmosphere around the measurement sample can be restrained from being affected by the atmosphere outside the measurement case, so that the temperature distribution of the measurement sample can be measured under the same atmosphere as the atmosphere used in making the regression model, thereby improving the estimation accuracy of the thermal conductivity.

In the thermal conductivity estimation apparatus according to the above aspect of the invention, it is preferable that the measurement unit includes a temperature holder configured to keep a temperature of the measurement case at a constant temperature.

According to the above arrangement, the atmosphere temperature around the measurement sample can be restrained from being affected by the temperature outside the measurement case, so that the temperature distribution of the measurement sample can be measured at the same atmosphere temperature as the temperature used in making the regression model.

In the thermal conductivity estimation apparatus according to the above aspect of the invention, it is preferable that the measurement unit includes an inert gas introduction unit configured to introduce an inert gas into the measurement case.

According to the above arrangement, oxidation of the surface of the measurement sample and consequent influence of an oxide on the temperature distribution of the surface can be restrained.

In the thermal conductivity estimation apparatus according to the above aspect of the invention, it is preferable that the measurement unit includes a heater configured to heat the measurement sample, and a heat-transfer reduction unit configured to restrain a heat of the heater from being transferred to the surface of the measurement sample through an atmosphere.

According to the above arrangement, the heat-transfer reduction unit restrains the heat from the heater from being transferred to the surface of the measurement sample through radiation and ambient atmosphere, so that the surface of the measurement sample is restrained from being unnecessarily heated by the heat to narrow the temperature distribution.

A method of producing a semiconductor crystal product according to still further aspect of the invention includes: preparing, as a measurement sample, a component of a production apparatus of the semiconductor crystal product; estimating the thermal conductivity of the component using the thermal conductivity estimation method according to the above aspect of the invention or the thermal conductivity estimation apparatus according to the above aspect of the invention; performing the heat-transfer simulation in a production step of the semiconductor crystal product using a result of the estimation of the thermal conductivity; and controlling a production apparatus of the semiconductor crystal product on a basis of a result of the heat-transfer simulation in the production step to produce the semiconductor crystal product.

A thermal conductivity calculator according to a further aspect of the invention includes: a measurement unit configured to measure a temperature of one or more points of a component of a crystal growth unit for a semiconductor; and an arithmetic unit configured to calculate a thermal conductivity of the component based on the temperature measured by the measurement unit using a regression model that outputs a thermal conductivity of the component in accordance with a plurality of inputs.

A thermal conductivity calculation program according to still further aspect of the invention, which is readable by a computer of a thermal conductivity calculator including a measurement unit, is configured to make the computer to perform: a measurement process of measuring a temperature of one or more points of a component of a crystal growth unit for a semiconductor using the measurement unit; and a calculation process of calculating a thermal conductivity of the component based on the temperature measured in the measurement process using a regression model configured to output a thermal conductivity of the component in accordance with a plurality of inputs.

A thermal conductivity calculation method according to still further aspect of the invention includes: a measurement step of measuring a temperature of one or more points of a component of a crystal growth unit for a semiconductor using a measurement unit; and a calculation step of calculating a thermal conductivity of the component based on the temperature measured in the measurement step using a regression model configured to output the thermal conductivity of the component in accordance with a plurality of inputs.

According to the above aspects of the invention, thermal conductivity of a component can be calculated from a temperature of the component. Since the thermal conductivity can thus be calculated without any restriction on the shape of the component and measurement environment, the thermal conductivity can be calculated on the spot. Consequently, the thermal conductivity of the component can be easily estimated, thereby enabling to address temporal change in the thermal conductivity and the like.

In the thermal conductivity calculator according to the above aspect of the invention, it is preferable that the temperature of the component when a physical property treated as a variable and parameters are varied is calculated through a simulation, and the regression model is derived from combinations, which are obtained through the simulation, of the physical property, the parameters and the temperature.

In the thermal conductivity calculation program according to the above aspect of the invention, it is preferable that the thermal conductivity calculation program is further configured to make the computer to perform: a simulation process of calculating through a simulation the temperature of the component when a physical property treated as a variable and parameters are varied; and a derivation process of deriving the regression model from combinations, which are obtained in the simulation process, of the physical property, the parameters and the temperature.

In the thermal conductivity calculation method according to the above aspect of the invention, it is preferable that the method further includes: a simulation step of calculating through a simulation the temperature of the component when a physical property treated as a variable and parameters are varied; and a derivation step of deriving the regression model from the combinations, which are obtained in the simulation step, of the physical property, the parameters and the temperature.

In the thermal conductivity calculator according to the above aspect of the invention, it is preferable that the physical property treated as a variable includes the thermal conductivity of the component.

In the thermal conductivity calculation program according to the above aspect of the invention, it is preferable that the physical property treated as a variable includes the thermal conductivity of the component.

In the thermal conductivity calculation method according to the above aspect of the invention, it is preferable that the physical property treated as a variable includes the thermal conductivity of the component.

In the thermal conductivity calculator according to the above aspect of the invention, it is preferable that the regression model is a model derived through machine learning, and the regression model is a model derived through the machine learning from training data in a form of the combinations, which are obtained through the simulation, of the physical property, the parameters and the temperature.

In the thermal conductivity calculation program according to the above aspect of the invention, it is preferable that the regression model is a model derived through machine learning, and the regression model is derived through the machine learning in the derivation process using training data in a form of the combinations, which are obtained in the simulation process, of the physical property, the parameters and the temperature.

In the thermal conductivity calculation method according to the above aspect of the invention, it is preferable that the regression model is a model derived through machine learning, and the regression model is derived through the machine learning in the derivation step using training data in a form of the combinations, which are obtained through the simulation, of the physical property, the parameters and the temperature.

In the thermal conductivity calculator according to the above aspect of the invention, it is preferable that the thermal conductivity calculator further includes: a heater configured to heat a crystal disposed within the crystal growth unit, in which the heater is configured to control a heating status of the crystal according to the thermal conductivity of the component calculated by the arithmetic unit.

In the thermal conductivity calculation program according to the above aspect of the invention, it is preferable that the thermal conductivity calculation program is further configured to make the computer to perform: a heating process of controlling a heating status of a crystal disposed in the crystal growth unit according to the thermal conductivity of the component calculated in the calculation process.

In the thermal conductivity calculation method according to the above aspect of the invention, it is preferable that the thermal conductivity calculation method further includes: a heating step of controlling a heating status of a crystal disposed in the crystal growth unit according to the thermal conductivity of the component calculated in the calculation step.

In the thermal conductivity calculator according to the above aspect of the invention, it is preferable that the measurement unit is an infrared thermography or a thermocouple.

In the thermal conductivity calculation program according to the above aspect of the invention, it is preferable that the measurement unit is an infrared thermography or a thermocouple.

In the thermal conductivity calculation method according to the above aspect of the invention, it is preferable that the measurement unit is an infrared thermography or a thermocouple.

DESCRIPTION OF EMBODIMENT(S)

First Exemplary Embodiment

A first exemplary embodiment of the invention will be described below with reference to the attached drawings. It should be noted that although a thermal conductivity of a cylindrical measurement sample is estimated in the present exemplary embodiment, the shape of the measurement sample is not necessarily cylindrical but may be a shape other than a cylinder.

Arrangement of Thermal Conductivity Estimation Apparatus

Figure 1:
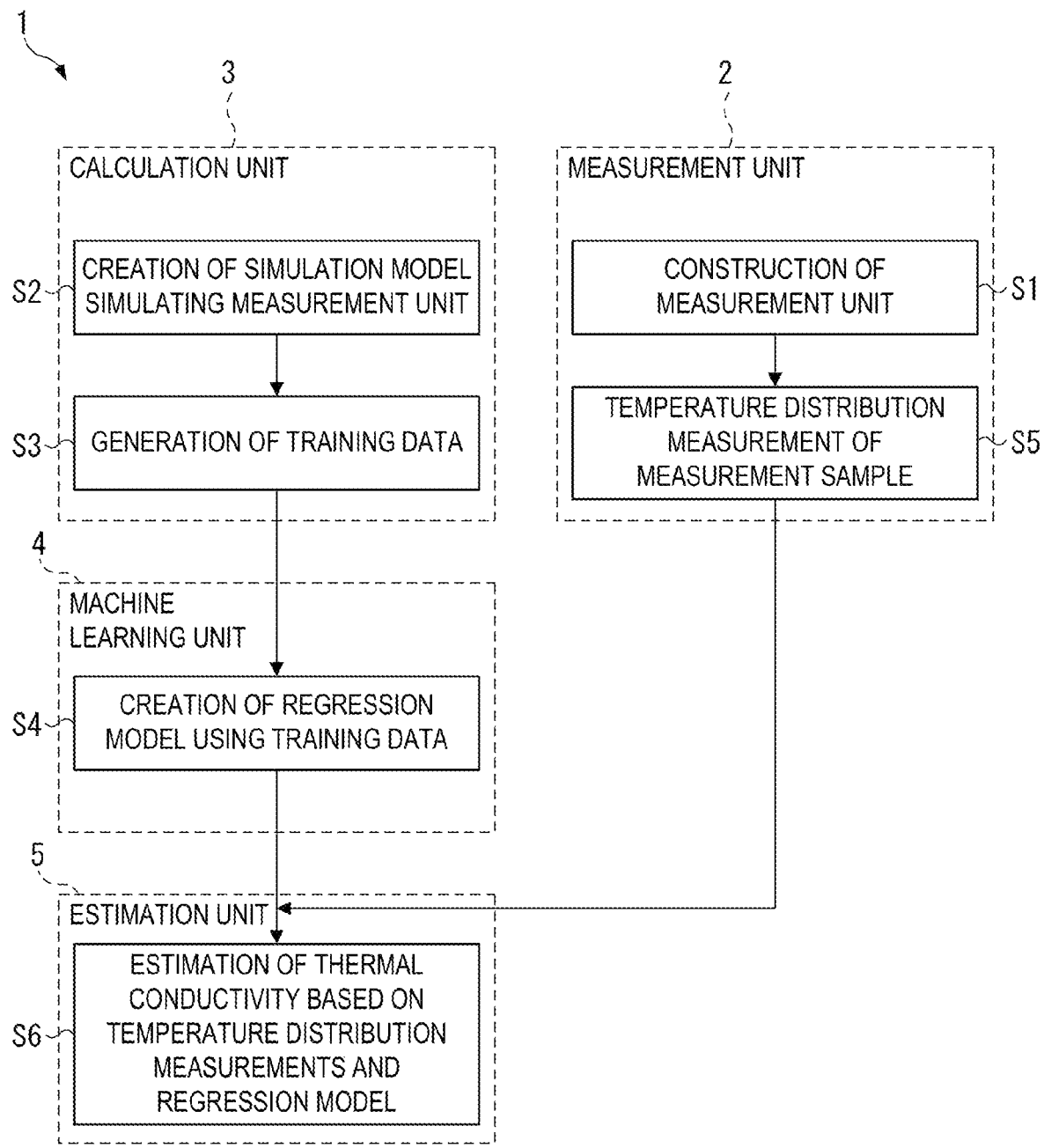
FIG. 1 illustrates an arrangement of a thermal conductivity estimation apparatus and a thermal conductivity estimation method according to a first exemplary embodiment of the invention.

As shown in FIG. 1, a thermal conductivity estimation apparatus 1, which is an apparatus for estimating the thermal conductivity of a cylindrical measurement sample 10 (see FIG. 2), includes a measurement unit 2, a calculation unit 3, a machine learning unit 4, and an estimation unit 5. Examples of the measurement sample 10, which are not specifically limited, include a component per se of a production apparatus for producing a semiconductor crystal product (e.g. a monocrystalline silicon and a silicon wafer), and a sample made of the same material as the component or a substitution material having similar heat-transfer properties. Examples of the production apparatus for the monocrystalline silicon include a monocrystalline silicon pull-up device used in a Czochralski method. Examples of the production apparatus of a silicon wafer include a slicer of a monocrystalline silicon, a polisher of a silicon wafer, and a vapor growth apparatus of an epitaxial silicon wafer. Examples of the component of the above-described production apparatus include hot zone parts of the monocrystalline silicon pull-up device (e.g. chamber, crucible, heater, pull-up cable, heat shield, and heat insulation material), inner wall material of the monocrystalline silicon pull-up device or the vapor growth apparatus, susceptor of the vapor growth apparatus, and parts of the slicer and polisher.

Figure 2:
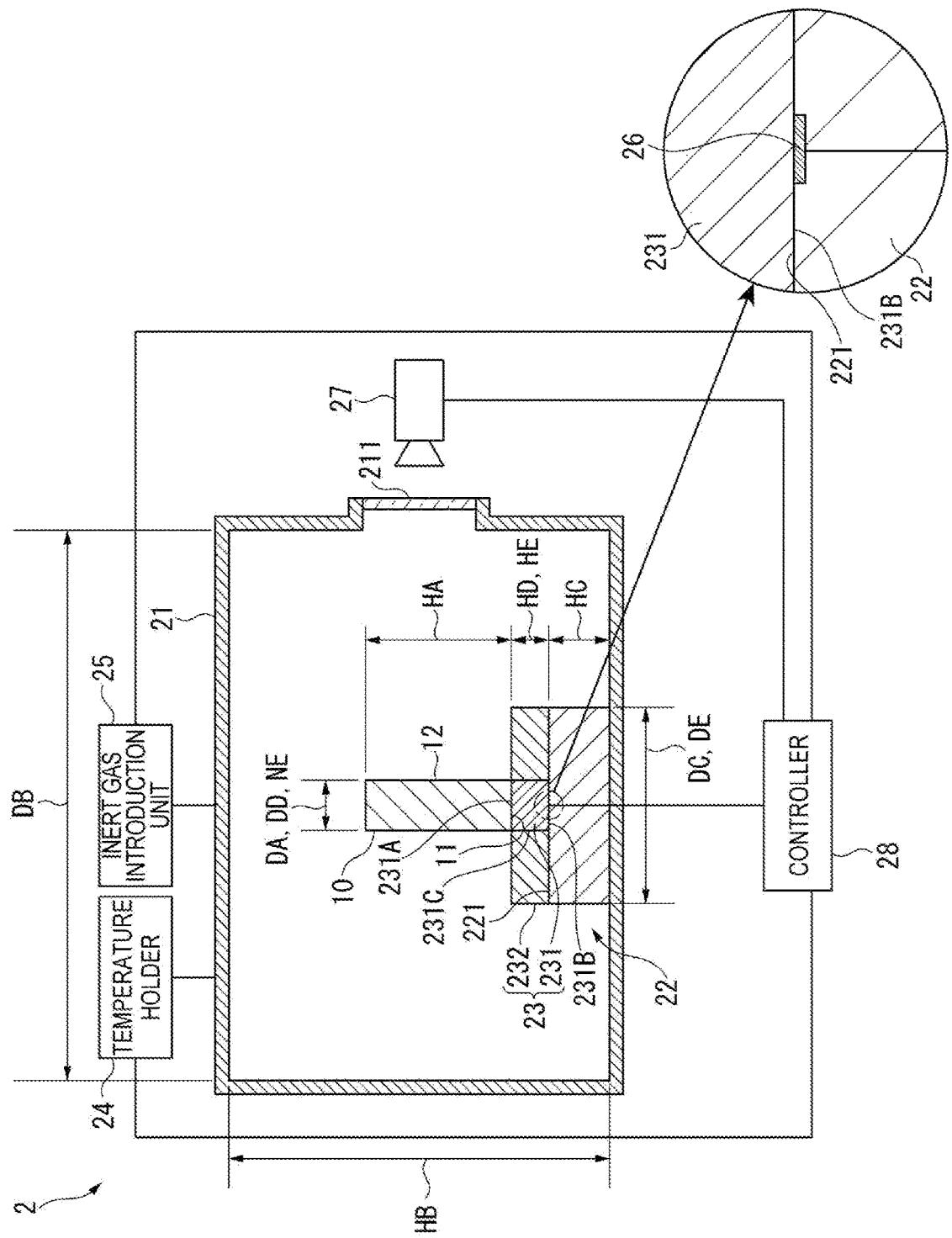
FIG. 2 is a schematic illustration of a measurement unit of the thermal conductivity estimation apparatus according to the first exemplary embodiment.

As shown in FIG. 2, the measurement unit 2 includes a measurement case 21, a heater 22, a heat-transfer reduction unit 23, a temperature holder 24, an inert gas introduction unit 25, a thermocouple 26, a measurement unit 27, and a controller 28. It should be noted that the measurement case 21, heater 22, heat-transfer reduction unit 23, and measurement sample 10, which are exemplarily shaped and arranged as axisymmetric cylinders (i.e. in concentric circles) in a top plan in the present exemplary embodiment, are optionally not axisymmetric or cylindrical. The center of at least one of the components 10, 21, 22, 23 is optionally misaligned with the center of the rest of the components.

The axisymmetric cylindrical configuration of the measurement system (i.e. the components 10, 21, 22, 23 of the measurement unit 2) of the present exemplary embodiment facilitates construction of the heat-transfer simulation model in the calculation unit 3.

The measurement case 21 is a hollow box-shaped component with a substantially cylindrical outer shape. An observation window 211 is provided on a lateral surface of the measurement case 21.

The heater 22 is a hot plate disposed at the center of a bottom surface of the measurement case 21. The heater 22 includes a circular heating surface 221 whose area is larger than a bottom surface 11 of the measurement sample 10.

The heat-transfer reduction unit 23 is configured to restrain the heat of the heater 22 from being transferred to a surface (lateral surface) 12 of the measurement sample 10. The heat-transfer reduction unit 23 includes a heat-transfer member 231 and a heat insulator 232.

The heat-transfer member 231, which is a disc-shaped component made of aluminum, includes: a top surface 231A (first contact face), on which the measurement sample 10 is placed; a bottom surface 231B (second contact face) in contact with the heater 22; and a lateral surface 231C positioned between the top surface 231A and the bottom surface 231B. The top surface 231A and the bottom surface 231B have the same shape as the bottom surface 11 (contact face) of the measurement sample 10. The heat-transfer member 231 is placed at the center of the heating surface 221. The heat-transfer member 231 is preferably configured to transfer as much heat from the heater 22 as possible to the bottom surface 11 of the measurement sample 10. For this reason, the thermal conductivity of the heat-transfer member 231 is preferably as high as possible (e.g. 200 W/mK or more).

The heat insulator 232 is an annular disc-shaped carbon component, whose thickness is substantially the same as that of the heat-transfer member 231 and whose hollow portion has a diameter substantially the same as an outer diameter of the heat-transfer member 231. The heat-transfer member 231 is fitted into the hollow portion of the heat insulator 232. In other words, the heat insulator 232 is configured to cover the entirety of the lateral surface 231C of the heat-transfer member 231 with its center being aligned with the center of the heating surface 221. With the above arrangement, the heat insulator 232 restrains the heat from the heater 22 and the heat from the heat-transfer member 231 from being transferred to the surface 12 of the measurement sample 10 through radiation and ambient atmosphere. For this reason, the thermal conductivity of the heat insulator 232 is preferably as low as possible (e.g. 1 W/mK or less). In addition to the annular disc-shaped portion covering the entirety of the lateral surface 231C of the heat-transfer member 231, the heat insulator 232 optionally includes a hollow cylindrical portion covering the entirety of the lateral surface of the heater 22.

The heat-transfer reduction unit 23, which includes the heat-transfer member 231 and the heat insulator 232, is required to restrain the heat from the heater 22 from being transferred to the surface 12 of the measurement sample 10 through radiation and the ambient atmosphere, while allowing much heat to be transferred from the heater 22 only to the bottom surface 11 of the measurement sample 10. For this reason, the material and thickness of the heat-transfer member 231 and the heat insulator 232 are preferably appropriately determined depending on the heating amount of the heater 22.

The temperature holder 24 is configured to water-cool the measurement case 21 in order to keep the measurement case 21 at a constant temperature. The measurement case 21 is optionally kept at the constant temperature through air-cooling and/or using a heat sink instead of water-cooling.

The inert gas introduction unit 25 is configured to purge an inside of the measurement case 21 with an inert gas. Examples of the inert gas are, though not limited to, nitrogen gas and argon gas.

A thermocouple 26 is disposed between the heating surface 221 of the heater 22 and the bottom surface 231B of the heat-transfer member 231. The thermocouple 26 is electrically connected to the controller 28. It should be noted that the heating surface 221, which is illustrated to define a dent of the same shape as the thermocouple 26 in FIG. 2 for the convenience of understanding of the structure, is actually substantially flat. However, because the thermocouple 26 is extremely thin, the heating surface 221 and the bottom surface 231B are tightly in contact with each other even when the thermocouple 26 is provided.

The measurement unit 27 is a thermoviewer disposed at a position facing the observation window 211 of the measurement case 21. The measurement unit 27 is electrically connected to the controller 28. The measurement unit 27 is configured to measure a temperature distribution of the measurement sample 10 and output the measurement result to the controller 28.

When the temperature holder 24 is configured to control the temperature by water-cooling or air-cooling, the controller 28 controls the temperature holder 24 so that the measurement case 21 is kept at a constant temperature. The controller 28 controls the inert gas introduction unit 25 to turn the atmosphere inside the measurement case 21 into an inert gas atmosphere. The controller 28 controls the heater 22 with reference to the measurement result of the temperature of the thermocouple 26. The controller 28 acquires the temperature distribution of the measurement sample 10 from the measurement unit 27 when a steady state is reached and outputs the temperature distribution to the estimation unit 5.

The calculation unit 3 prepares training data. The training data is a set of pairs of an input and an output of a function (e.g. a desirable output d for a certain input x) for determining a target network function. The training data is used by the machine learning unit 4 for making a regression model using a machine learning technique.

A large amount of training data needs to be collected in order to make the regression model, but is difficult to collect through experiments. Accordingly, the training data is made through a simulation using an analysis software in the present exemplary embodiment.

The calculation unit 3 performs a heat-transfer simulation for a plurality of combinations of provisional thermal conductivities and heating conditions of a sample model of the same shape as the measurement sample 10 to calculate a temperature distribution of a surface of the sample model for each of the plurality of combinations. For the calculation, the calculation unit 3 performs the heat-transfer simulation on the basis of a known physical model in consideration of heat transfer within and into/out of the measurement case 21 in terms of heat conduction, heat transmission, and heat radiation.

The calculation unit 3 outputs, to the machine learning unit 4, calculation results of the surface temperature distribution, and combinations of the provisional thermal conductivities and heating conditions used for the calculation of the surface temperature distribution as the training data. The analysis software used in the calculation unit 3 is not limited to a specific one, but may be commercially available analysis software.

The machine learning unit 4 makes the regression model, whose input is the temperature distribution of the measurement sample 10 and whose output is the thermal conductivity of the measurement sample 10, through a machine learning technique with the use of the training data received from the calculation unit 3. The machine learning unit 4 outputs the thus made regression model to the estimation unit 5. The machine learning technique used by the machine learning unit 4, examples of which are methods using a neural network or a genetic algorithm, is not specifically limited, but may be any known method (e.g. a support vector machine and sparse model).

The "machine learning technique" refers to a method of finding regularity in a large amount of data with a computer and using the thus found regularity for analysis and/or prediction of the data. One of the great features of the machine learning technique is that, if the learning is successful, the results can be predicted even based on unknown information not learned at the time of the training. The term "regression" refers to determination of a function capable of precisely reproducing the training data from among functions which take continuous output values (e.g. numerical values).

In the present exemplary embodiment, the machine learning unit 4 makes the regression model using a neural network. The neural network is a technique simulating a nerve net of a living organism.

Figure 3:
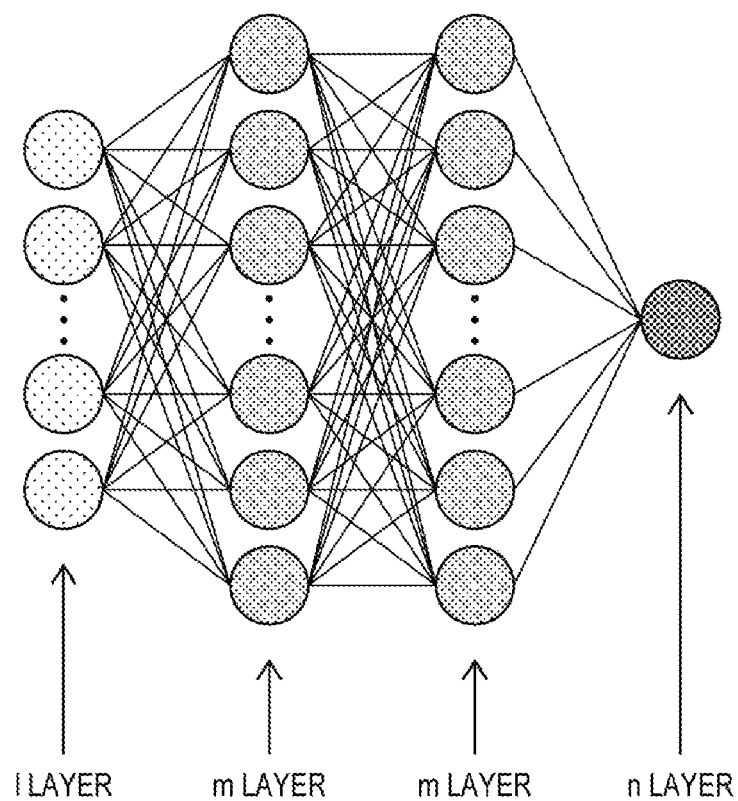
FIG. 3 shows hierarchical structure of a neural network used in the first exemplary embodiment and a second exemplary embodiment of the invention.

The model used for the regression analysis of the regression model using the neural network will be described below. As shown in FIG. 3, the neural network of the present exemplary embodiment has a hierarchical structure including l layer, m layer, and n layer. The l layer is an input layer. The m layer is a hidden layer. The n layer is an output layer.

The temperature distribution of the measurement sample 10 is input to the I layer. The hidden layer has two layers and 128 neurons. The n layer outputs the thermal conductivity of the measurement sample 10. In the present exemplary embodiment, a sigmoid function is used for an activation function and Adam (Adaptive Moment Estimation) is used for adjustment of a learning rate.

The estimation unit 5 receives the temperature distribution measurement result of the surface 12 of the measurement sample 10 from the measurement unit 2 and inputs the temperature distribution measurement result into the regression model to estimate the thermal conductivity of the measurement sample 10.

Thermal Conductivity Estimation Method

Next, a thermal conductivity estimation method using the above-described thermal conductivity estimation apparatus 1 will be described below.

As shown in FIG. 1, a worker constructs the measurement unit 2 of the above-described structure (Step S1).

Before/after or concurrently with the process in Step S1, the calculation unit 3 constructs the simulation model simulating the measurement unit 2 on the basis of an instruction input of the worker (Step S2). In constructing the simulation model, the size and physical properties of components are set as known values. Examples of the components whose sizes are set include a shape of the inner space of the measurement case 21, an outer shape of the measurement sample 10, an outer shape of the heater 22, an outer shape of the heat-transfer member 231, and an outer shape of the heat insulator 232. Examples of the physical properties to be set include the temperature, pressure, atmosphere, and convection occurrence within the measurement case 21, and thermal conductivities of the heat-transfer member 231 and the heat insulator 232. A corresponding one to the measurement sample 10 is referred to as "sample model" in the simulation model hereinafter.

After the process in Step S2, the calculation unit 3 performs the heat-transfer simulation in accordance with the simulation model to make the training data (Step S3). During the process in Step S3, after setting the provisional ranges of the thermal conductivity and the heating temperature of the sample model in accordance with the input by the worker, the calculation unit 3 sets a plurality of calculation conditions in any combinations of the provisional thermal conductivities and the heating temperatures within the above ranges. In order to improve the accuracy of the regression model in the machine learning unit 4, the number of the calculation conditions set at this time is preferably as many as possible.

The calculation unit 3 performs the heat-transfer simulation for each of the plurality of calculation conditions to calculate the temperature distribution of the surface 12 in the steady state when only the bottom surface of the sample model is heated. At this time, in order to improve the accuracy of the regression model in the machine learning unit 4, the calculation is preferably made assuming the same measurement system as the measurement unit 2 and the same atmosphere as the atmosphere during the temperature distribution measurement. The calculation unit 3 outputs, to the machine learning unit 4, combinations of the provisional thermal conductivities, the heating temperatures, and the thus obtained temperature distributions of the surface 12 in a form of the training data. It should be noted that the training data is optionally input to the machine learning unit 4 through an input operation by the worker.

After the process of Step S3, using the training data, the machine learning unit 4 makes the regression model whose input is the temperature distribution measurement result of the surface 12 of the measurement sample 10 received from the measurement unit 2 and the heating condition at the time of the temperature distribution measurement, and whose output is the thermal conductivity of the measurement sample 10 (Step S4), and outputs the regression model to the estimation unit 5. It should be noted that the regression model is optionally input to the estimation unit 5 through an input operation by the worker.

Before/after or concurrently with the processes in Steps S2 to S4, the measurement unit 2 measures the temperature distribution of the measurement sample 10 of the same shape as the sample model under the same conditions as those in the simulation model constructed by the calculation unit 3 (Step S5).

During the process of Step S5, the controller 28 of the measurement unit 2 estimates the temperature of the bottom surface 11 of the measurement sample 10 on the basis of temperature measurement results of the thermocouple 26. At this time, with the use of the heat-transfer member 231 made of aluminum, whose thermal conductivity is high (200 W/mK), the temperature of the bottom surface 11 estimated on the basis of the measurements of the thermocouple 26 becomes substantially equal to an actual temperature of the bottom surface 11. The controller 28 controls the heater 22 so that the estimated temperature becomes equal to a heating temperature (preset heating temperature) set in accordance with an input setting by the worker.

The controller 28 controls the measurement unit 27 to acquire the temperature distribution measurement results of the measurement sample 10 at a predetermined interval, and outputs the temperature distribution obtained when a difference between an estimated temperature of the bottom surface 11 and the preset heating temperature falls within a tolerable range and the temperature distribution shows no temporal change (i.e. when the steady state is reached), to the estimation unit 5.

In order to highly accurately estimate the thermal conductivity of the measurement sample 10 by the estimation unit 5, a temperature distribution when a single part of the measurement sample 10 is only heated is preferably used so that the temperature gradient becomes unidirectional. In the present exemplary embodiment, it is preferable to use the temperature distribution when only the bottom surface of the measurement sample 10 is heated.

When the measurement sample 10 is placed to be heated on the heating surface 221 of the heater 22, the radiation heat from the heater 22, which is also measured by the measurement unit 27, is likely to leave an effect on the temperature distribution measurement result of the measurement sample 10.

In the present exemplary embodiment, since the measurement sample 10 is placed on the heat-transfer member 231, a distance from the heater 22 to a lower part of the measurement sample 10 can be increased, so that the heat transfer from the heater 22 to the atmosphere around the measurement sample 10 can be restrained. Especially, since the entirety of the lateral surface 231C of the heat-transfer member 231 is covered with the heat insulator 232, the heat transferred from the heating surface 221 to the atmosphere around the lower part of the measurement sample 10 can be more effectively reduced. Accordingly, the temperature distribution solely reflecting the temperature of the surface 12 of the measurement sample 10 can be measured by the measurement unit 27, allowing highly accurate estimation of the thermal conductivity of the measurement sample 10.

In the case where the temperature of the measurement case 21 in the simulation model is set at a predetermined temperature, it is preferable for the controller 28 to control the temperature holder 24 to adjust the temperature of the measurement case 21 to the predetermined temperature. With such an arrangement, the temperature of the atmosphere around the measurement sample 10 can be restrained from being changed by the temperature outside the measurement case 21, thus allowing the measurement of the temperature distribution of the measurement sample 10 under the same condition as that in the simulation model.

In the case where the inside of the measurement case 21 in the simulation model is set to be an inert gas atmosphere, it is preferable for the controller 28 to control the inert gas introduction unit 25 to purge the inside of the measurement case 21 with an inert gas. With such an arrangement, the surface 12 of the measurement sample 10 can be restrained from being oxidized by the heating, thereby reducing an effect of an oxide on the temperature distribution of the surface 12.

After the processes of Steps S4 and S5, the estimation unit 5 inputs to the regression model the temperature distribution measurement result from the measurement unit 2 and the heating condition at the time of the temperature distribution measurement to estimate the thermal conductivity of the measurement sample 10 (Step S6).

Method of Using Thermal Conductivity Estimation Result

With the use of the measurement sample 10 in a form of a component of a production apparatus of a semiconductor crystal product (e.g. semiconductor monocrystal and semiconductor board), the thermal conductivity of the component can be easily estimated through the above-described thermal conductivity estimation method.

Products of desired properties can be easily produced by applying the estimation result of the thermal conductivity to the heat-transfer simulation in a production step of the semiconductor monocrystal or the semiconductor board, and controlling the production apparatus of the semiconductor monocrystal or the semiconductor board on the basis of the results of the heat-transfer simulation in the production step.

Instead of the component, the measurement sample 10 is optionally in a form of an object of a substitution material having similar heat-transfer properties.

Effect of First Exemplary Embodiment

According to the first exemplary embodiment, the thermal conductivity estimation apparatus 1 performs the heat-transfer simulation on the sample model by setting the shape of the sample model to the same shape as the measurement sample 10 and inputting the provisional thermal conductivities without specifying the material. The thermal conductivity estimation apparatus 1 makes the regression model based on the results of the heat-transfer simulation using the machine learning technique, and estimates the thermal conductivity of the measurement sample 10 by inputting the temperature distribution measurement result of the surface 12 of the measurement sample 10 into the regression model.

As described above, since the material of the sample model is not taken into consideration when the regression model is made, the thermal conductivity of various measurement samples 10 of different materials can be easily estimated using the regression model. Further, the thermal conductivity can be easily estimated in analyzing various heat-transfer patterns during the production step of the semiconductor crystal product.

Especially, since the temperature distribution measurement result and the heating condition at the time of the temperature distribution measurement are input to the regression model, the estimation accuracy of the thermal conductivity is improvable.

Modification(s) of First Exemplary Embodiment

It should be noted that the scope of the invention is not limited to the above-described exemplary embodiment but encompasses various improvements and design alterations as long as such improvements and alterations are compatible with an object of the invention.

For instance, the measurement sample 10, which is heated from below using a hot plate in the exemplary embodiment, is optionally heated from above or lateral side in some embodiments. However, the measurement sample is preferably heated from below as in the present exemplary embodiment for the convenience of setting the conditions for the heat-transfer simulation.

The measurement sample 10 is optionally not measured within the measurement case 21 in some embodiments.

The heat-transfer member 231 is optionally made of a material having a high thermal conductivity other than aluminum in some embodiments.

The heat insulator 232 is optionally made of a material having a low thermal conductivity other than carbon material in some embodiments.

The heat insulator 232 is not provided around the heat-transfer member 231 in some embodiments. Further, the bottom surface 11 of the measurement sample 10 and the heating surface 221 of the heater 22 are in direct contact with each other to heat the measurement sample 10 in some embodiments.

The measurement unit 2 does not include at least one of the temperature holder 24 or the inert gas introduction unit 25 in some embodiments.

The measurement unit 2 does not include the thermocouple 26 in some embodiments.

The measurement unit 27 is in a form of thermocouples attached to a plurality of positions located between the lower end and the upper end of the measurement sample 10 in some embodiments.

Second Exemplary Embodiment

Next, a second exemplary embodiment of the invention will be described below with reference to the attached drawings.

Arrangement of Crystal Growth System

Figure 4:
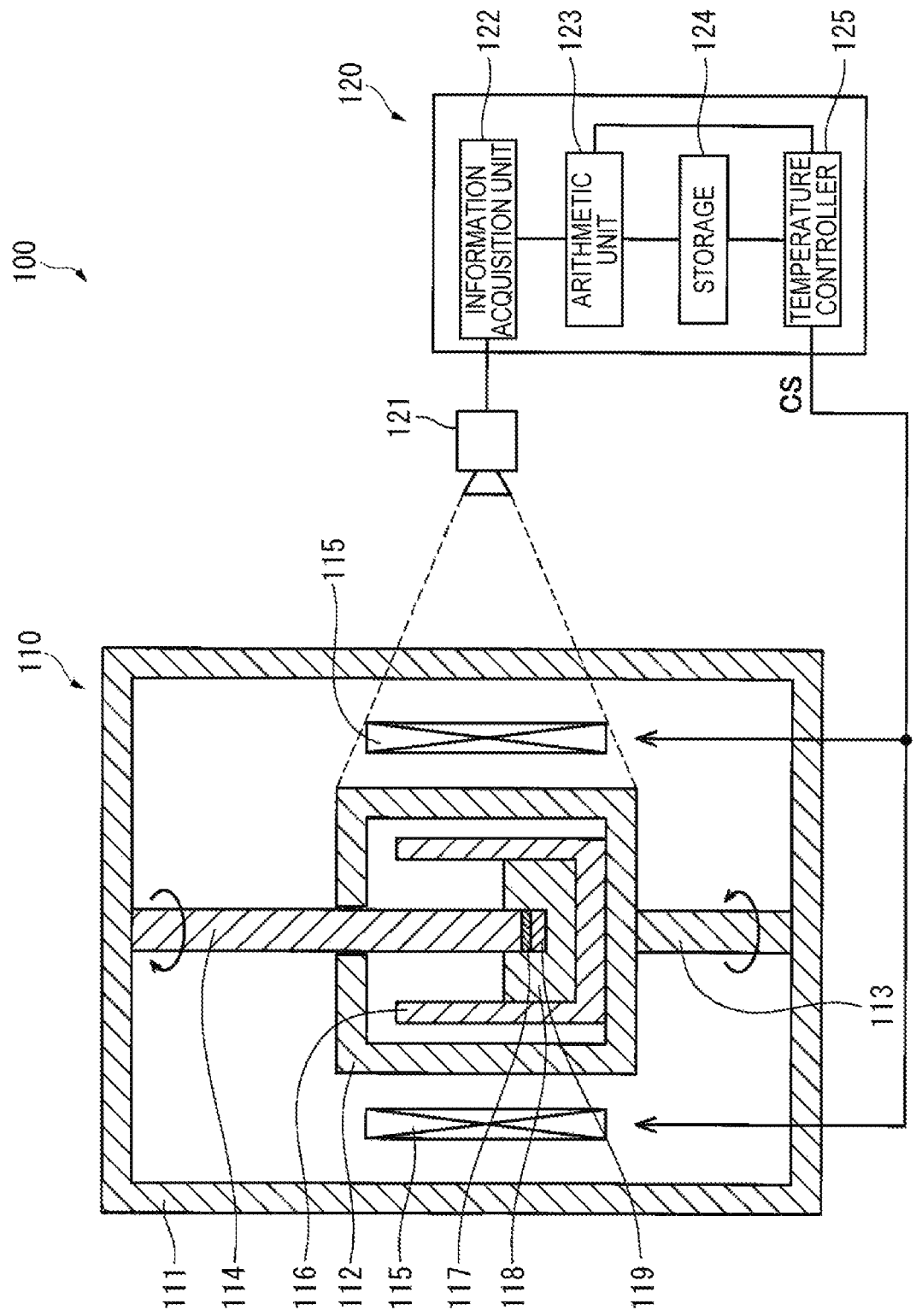
FIG. 4 is a schematic illustration of an arrangement of a crystal growth system according to the second exemplary embodiment.

As shown in FIG. 4, a crystal growth system 100 includes a crystal growth unit 110 and a thermal conductivity calculator 120.

The crystal growth unit 110 is a unit for liquid-phase growth of an SiC crystal. The crystal growth unit 110 includes a housing 111, a crucible housing 112, a rotary unit 113, a crystal holder 114, a high-frequency coil 115, and a crucible 116. The housing 111, which is a component having a cylindrical outer wall, houses the high-frequency coil 115 and the crucible housing 112. The crucible housing 112 houses the crucible 116. The surface of the crucible housing 112 is covered with a heat insulation material. The crucible 116 is made of a carbon material (graphite). The rotary unit 113 is a unit for rotating the crucible housing 112 and the crucible 116. The crystal holder 114 is a component for supporting a seed crystal 117 and a grown SiC crystal 119 so that the seed crystal 117 and the SiC crystal 119 are rotatable. The high-frequency coil 115 receives electric power from a power supply (not shown) to inductively heat the crucible 116.

A melt 118 is received in the crucible 116. The melt 118 is Si melt. Carbon atoms are released into the melt from the crucible 116. Thus, the SiC crystal 119 can be grown from the seed crystal 117 (SiC template).

The thermal conductivity calculator 120 includes a thermography camera (infrared thermography) 121, an information acquisition unit 122, an arithmetic unit 123, a storage 124, and a temperature controller 125. The thermography camera 121 is a measurement unit for measuring a temperature of one or more points of a component of the crystal growth unit 110. Specifically, the thermography camera 121 measures a surface temperature distribution of the heat insulation material provided on the crucible housing 112. For the convenience of illustration, the thermography camera 121 is shown to measure the target through the high-frequency coil 115 and the housing 111 in FIG. 4. However, in practice, a window (not shown) to be used for the measurement by the thermography camera 121 is provided to a part of each of the housing 111 and the high-frequency coil 115. The information acquisition unit 122 is an interface for acquiring the measurement results of the thermography camera 121.

The arithmetic unit 123 is, for instance, a CPU. The arithmetic unit 123 is a unit for making a regression model using machine learning in accordance with, for instance, a thermal conductivity calculation program stored in the storage 124, and calculating the thermal conductivity of the heat insulation material of the crucible housing 112 using the thus made regression model. The regression model is a model used in order to output the thermal conductivity of the heat insulation material of the crucible housing 112 in accordance with a plurality of inputs. The plurality of inputs include the temperature distribution measured by the thermography camera 121. The storage 124 is a unit for storing later-described simulation results and various data used by the arithmetic unit. Examples of the storage 124 include RAM, flash memory, HDD, and a combination thereof.

As described in the first exemplary embodiment, the training data has to be collected in order to make the regression model for calculating the thermal conductivity. The training data is a set of pairs of an input and an output of a function. Examples of the input of the training data include material physical properties and crystal growth conditions. Examples of the output of the training data include surface temperature distribution of the heat insulation material of the crucible housing 112, and temperature distribution of the melt 118 in the crucible 116.

Specific examples of the material physical properties as the input of the training data are the respective physical properties of the melt 118, the SiC crystal 119, and the crucible housing 112. Specific examples of the physical properties of the melt 118 include thermal conductivity, viscosity coefficient, density, specific heat, radiation factor, latent heat, contact angle, and surface tension. Specific examples of the physical properties of the SiC crystal 119 include thermal conductivity, specific heat, electric conductivity, density, elastic coefficient, expansion coefficient, and radiation factor. Specific examples of the physical properties of the crucible housing 112 include provisional thermal conductivity of the heat insulation material, specific heat, density, and radiation factor.

Specific examples of the crystal growth conditions as the input of the training data include a rotation speed of the crucible 116, a rotation speed of the crystal holder 114, a size of the crucible 116, electric power supplied to the high-frequency coil 115, the temperature of the melt 118, and a gas temperature in the housing 111.

As described in the first exemplary embodiment, it is difficult to collect a large amount of the training data through experiments. Accordingly, the training data is collected also through a simulation using analysis software in the present exemplary embodiment.

Initially, a three-dimensional model of the crystal growth unit 110 is created based on a CAD data. In the present exemplary embodiment, a three-dimensional model of the crucible housing 112 is created and marked with virtual grids (mesh).

Subsequently, a plurality of input parameter sets are input. The input parameter sets include the material physical property and crystal growth conditions. In the present exemplary embodiment, a provisional thermal conductivity of the heat insulation material of the crucible housing 112 is used as the material physical property of the input parameter set. The surface temperature of the heat insulation material of the crucible housing 112, the rotation speed of the crucible 116, the position and rotation speed of the crystal holder 114, the size of the crucible 116, the electric power supplied to the high-frequency coil 115, the temperature of the melt 118, and the gas temperature in the housing 111 are used as the crystal growth conditions of the input parameter set. Then, a plurality of input parameter sets, which are in a form of various combinations of the material physical property and the crystal growth conditions, are input.

The material physical property (the provisional thermal conductivity of the heat insulation material of the crucible housing 112), which is a numerical value showing a physical property of a substance, is essentially a constant value. However, the material physical property is varied in the present exemplary embodiment when the plurality of input parameter sets are input. In other words, the material physical property is treated as a variable. The regression model according to the present exemplary embodiment is thus applicable to an instance with variable material physical property. The material physical property varies when, for instance, the thermal conductivity of the heat insulation material changes due to degradation of the heat insulation material of the crucible housing 112. A variable width of the material physical property in a form of a variable preferably falls within a range of ±10%.

The resultant input parameter sets are used to perform simulation calculations. Each time the simulation is performed, one output result (the surface temperature distribution of the heat insulation material of the crucible housing 112) is obtained per one input parameter set. Results of, for instance, 10 patterns or more and 10000 patterns or less can be obtained through repetition of the simulations. These results are stored in the storage 124.

In the present exemplary embodiment, the regression model is made using a neural network as in the first exemplary embodiment. Specifically, the arithmetic unit 123 performs the machine learning using the training data stored in the storage 124 through the above-described simulations to make the regression model.

In the present exemplary embodiment, the neural network shown in FIG. 3 is used. The temperature measured by the thermography camera 121 (the surface temperature of the heat insulation material of the crucible housing 112), the rotation speed of the crucible 116, the position and rotation speed of the crystal holder 114, and the gas temperature in the housing 111 are input to the I layer of the neural network. The n layer outputs the thermal conductivity of the heat insulation material of the crucible housing 112. The activation function is a sigmoid function and the learning rate is adjusted by Adam also in the present exemplary embodiment.

The temperature controller 125 is a unit for controlling the electric current supplied to the high-frequency coil 115 installed in the crystal growth unit 110. A control signal CS is outputted from the temperature controller 125 to the high-frequency coil 115. The temperature controller 125 controls a heating status of the crucible 116 according to the thermal conductivity of the heat insulation material of the crucible housing 112 calculated by the arithmetic unit 123.

Thermal Conductivity Calculation Method

Next, a process for calculating the thermal conductivity using the regression model will be described below.

Figure 5:
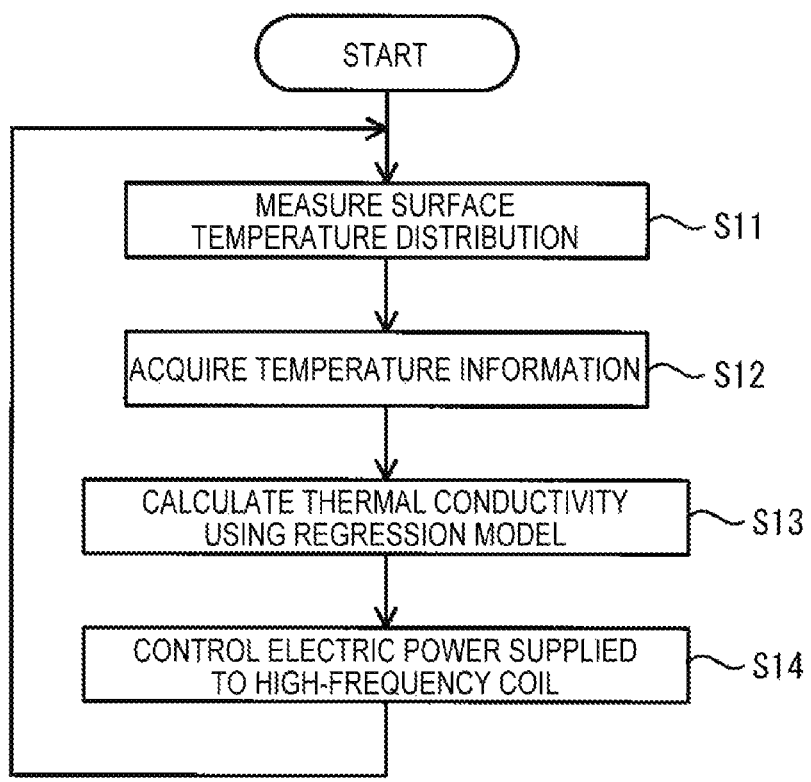
FIG. 5 is a flowchart showing a thermal conductivity calculation method according to the second exemplary embodiment.

As shown in FIG. 5, the information acquisition unit 122 measures the surface temperature distribution of the heat insulation material of the crucible housing 112 using the thermography camera 121 (Step S11). Subsequently, the arithmetic unit 123 acquires the temperature information on a plurality of coordinates in the measured surface temperature distribution (Step S12). Then, the arithmetic unit 123 inputs to the regression model the acquired temperature information of the plurality of coordinates, the gas temperature in the housing 111, the rotation speed of the crucible 116, and the position and rotation speed of the crystal holder 114 (Step S13). Estimated value of the thermal conductivity of the heat insulation material of the crucible housing 112 can thus be calculated.

The temperature controller 125 controls the electric power supplied to the high-frequency coil 115 based on the calculated thermal conductivity of the heat insulation material of the crucible housing 112 (Step S14). For instance, in order to keep the temperature of the melt 118 at a constant level, the supplied electric power is optionally increased as the thermal conductivity of the heat insulation material increases (i.e. as the material degrades). The processes in S11 to S14 are then repeated.

Effect of Second Exemplary Embodiment

Examples of known methods for measuring the thermal conductivity include laser flashing and the like. However, various restrictions on the status of the sample and the measurement conditions are present in these known measurement methods. For instance, it is required that the measurement sample should be a flat plate of a dense material with a smooth surface and that the measurement should be performed in a vacuum insulation environment. For the above reason, it has been difficult to measure the thermal conductivity of, for instance, various components of the crystal growth unit 110 (e.g. the heat insulation material of the crucible housing 112).

According to the crystal growth system 100 of the second exemplary embodiment, the use of the regression model for outputting the thermal conductivity allows easy calculation of the estimated value of the thermal conductivity of the component of the crystal growth unit 110 on the basis of the surface temperature distribution of the component. Since the thermal conductivity can be calculated without restrictions on the status of the sample and measurement conditions, the variation in the thermal conductivity of the component of the crystal growth unit 110 can be observed on the spot.

In the crystal growth unit 110, the melt 118 is heated to a high temperature exceeding 2000 degrees C. After an elapse of certain period of time, the heat insulating performance of the heat insulation material of the crucible housing 112 deteriorates during the use thereof, so that the initially set conditions changes. Accordingly, it is difficult to keep the temperature of the melt 118 at a constant level.

In the crystal growth system 100, the variation in the thermal conductivity of the heat insulation material of the crucible housing 112 can be observed on the spot from the surface temperature distribution of the crucible housing 112. The temperature of the melt 118 can be kept at a constant level by controlling the heating status of the crucible 116 according to the thermal conductivity observed on the spot. Thus, the SiC crystal 119 can be uniformly grown.

Modification(s) of Second Exemplary Embodiment

The target whose temperature is measured and the target whose thermal conductivity is calculated are optionally various components of the crystal growth unit 110 other than the crucible housing 112 in some embodiments. For instance, the surface temperature of the crucible 116 is measured in some embodiments to calculate the thermal conductivity of the melt 118 in the crucible. Moreover, the surface temperature of the crucible 116 is optionally measured in some embodiments to calculate the thermal conductivity of the crucible 116.

The target whose thermal conductivity is calculated is the component of the crystal growth unit 110 in the exemplary embodiments. However, the technique disclosed herein is applicable to components of various devices other than the crystal growth unit.

The input of the regression model, which is the temperature measured by the thermography camera 121, the gas temperature in the housing 111, the rotation speed of the crucible 116, the position and rotation speed of the crystal holder 114 in the second exemplary embodiment, is not limited to these properties. In other words, any combination of properties selected from the examples listed for the material physical properties and the crystal growth conditions is usable as the input of the regression model.

The output of the regression model, which is the thermal conductivity of the heat insulation material of the crucible housing 112 in the second exemplary embodiment, is at least one of various parameters other than the thermal conductivity in some embodiments. For instance, the output is optionally the thermal conductivity of the melt 118, the temperature of the melt 118, or the like.

The device for measuring the temperature of the component of the crystal growth unit 110 is not necessarily the thermography camera 121 but may be various devices other than the thermography camera. For instance, a thermocouple is used in some embodiments. In this case, when the thermocouple is attached to a surface of the component (e.g. the crucible housing 112), the surface temperature is measurable. When the thermocouple is inserted into an inside of the component, the inner temperature of the component is measurable. An example of other measurement unit is a strain gauge, which inversely calculates the temperature of the component on the basis of a variation in a dimension of a component or the like.

The use of the neural network, which is described as an example of machine learning, is not requisite. For instance, other various processes (e.g. a support vector machine and sparse model) are usable.

The semiconductor crystal to be grown by the crystal growth unit 110 is not limited to SiC.

The thermography camera 121 is merely an example of the measurement unit. The thermal conductivity of the heat insulation material of the crucible housing 112 is merely an example of the physical property to be treated as a variable. The electric power supplied to the high-frequency coil 115, the temperature of the melt 118, the gas temperature in the housing 111, the rotation speed of the crucible 116, the rotation speed of the crystal holder 114, and the size of the crucible 116 are merely examples of the various parameters. The temperature controller 125 is merely an example of the heater.

EXAMPLES

Next, the invention will be described in further detail below with reference to Examples and Comparatives. It should however be noted that the invention is by no means limited by these Examples and Comparatives.

Experiment 1: Evaluation of Regression Model
Creation of Regression Model

A regression model for estimating the thermal conductivity of the measurement sample 10 was created.

Initially, the calculation unit 3 was used to construct a simulation model simulating the measurement unit 2. The software used for the calculation unit 3 was "CGSim" produced by SGR Japan K.K.

When the model was constructed, the conditions as shown in Table 1 below were set.

TABLE 1

| Sample Model | Shape | cylinder |
|---|---|---|
|  | Diameter (DA) | 20 mm |
|  | Height (HA) | 70 mm |
| Measurement Case | Shape | hollow box with outer cylindrical profile |
|  | Inner Diameter (DB) | 600 mm |
|  | Inner Height (HB) | 300 mm |
| Heater | Shape | cylinder |
|  | Diameter of Heating Surface (DC) | 150 mm |
|  | Height (HC) | 65 mm |
| Heat-Transfer Member | Shape | circular disc |
|  | Diameter (DD) | 20 mm |
|  | Height (HD) | 10 mm |
|  | Material | aluminum |
|  | Thermal Conductivity | 202 W/mK |
| Heat Insulator | Shape | annular plate |
|  | Diameter (DE) | 150 mm |
|  | Inner Diameter (NE) | 20 mm |
|  | Height (HE) | 10 mm |
|  | Thermal Conductivity | 0.15 W/mK |
| Status in Measurement Case | Temperature | 27 degrees C. |
|  | Pressure | atmospheric pressure |
|  | Atmosphere | nitrogen |
|  | Convection | none |

Next, the range of the provisional thermal conductivity of the sample model was set in a range from 10 W/mK to 150 W/mK and the range of the heating temperature was set so that the temperature of the bottom surface of the sample model fell in a range from 90 degrees C. to 110 degrees C. 1875 calculation conditions were defined by combinations of any ones of the provisional thermal conductivities and heating temperatures within the above set range. Using the calculation unit 3, the heat-transfer simulation for each of the calculation conditions based on the simulation model was performed to calculate the surface temperature distribution in the steady state when only the bottom surface of the sample model was heated. Temperatures of total 21 parts at the upper and lower ends of 20 areas, which were defined by equidistantly dividing the sample model in up-down direction, were extracted from the calculation results as the temperature distribution to be used as the training data. The extracted temperature distribution and the combination of the provisional thermal conductivity and the heating temperature used for calculating the temperature distribution were input to the machine learning unit 4 as the training data.

The training data was inputted to the machine learning unit 4 and the machine learning unit 4 performs machine learning of the provisional thermal conductivity and the surface temperature distribution of the sample model, thereby making a regression model whose input was the temperature distribution and heating condition of the measurement sample 10 and whose output was the thermal conductivity of the measurement sample 10. At the time of making the regression model, the machine learning using the neural network, whose parameters were as follows, was performed. The software library used for the machine learning was TENSORFLOW (registered trademark) produced by Google Inc.

Hidden layer: two layers
The number of neurons: 128
Learning method: Adam
Number of epochs: 1000
Activation function: Sigmoid
Module: Keras
Details of Regression Model Next, the regression model was evaluated.

Initially, 50 combinations of the provisional thermal conductivities and the heating temperatures not used for making the regression model (i.e. not used as the training data) were defined as evaluation conditions. The provisional thermal conductivities and the heating temperatures for the evaluation conditions were selected from those falling within the range defined when the regression model was made.

Next, the heat-transfer simulation was performed on each of the evaluation conditions based on the simulation model to calculate the surface temperature distribution. The surface temperatures at 21 parts as in making the regression model were extracted from the calculation results, and the extracted surface temperature distributions and the heating conditions were input to the regression model to obtain the estimation results of the thermal conductivity corresponding to the evaluation conditions.

Figure 6:
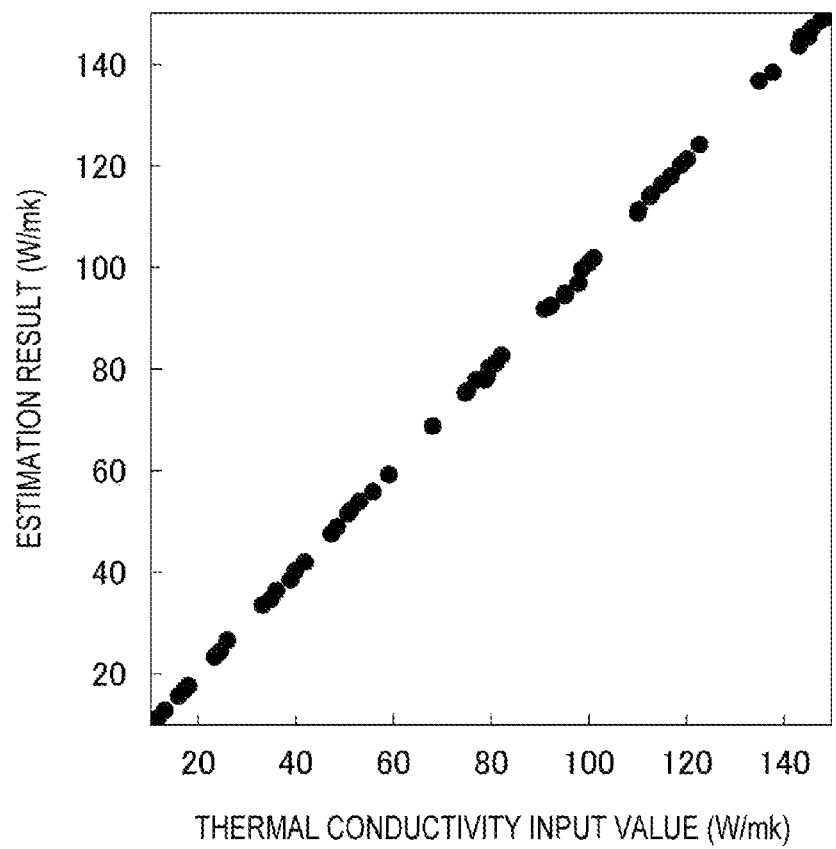
FIG. 6 is a graph showing an evaluation result of a regression model according to Examples of the invention.

A scatter diagram, whose abscissa axis represents the provisional thermal conductivities (thermal conductivity input values) defined as the evaluation conditions and whose ordinate axis represents the estimation results of the thermal conductivities obtained by inputting the surface temperature distribution obtained by the heat-transfer simulation results based on the provisional thermal conductivities into the regression model, is shown in FIG. 6.

As shown in FIG. 6, the thermal conductivity input values and the thermal conductivity estimation results, which highly accurately matched each other, showed multiple correlation coefficient of 0.999944. In view of the above results, it was confirmed that the regression model of the invention had a potential of highly accurately estimating the thermal conductivity of the measurement sample 10.

Experiment 2: Comparison Between Actual Measurements and Estimation Result of Thermal Conductivity
Selection of Measurement Sample An aluminum bronze sample and an SUS sample were prepared as the measurement samples. The reason is as follows.

Examples of the material of the components frequently used for the production apparatus of the semiconductor crystal product (e.g. monocrystalline silicon and silicon wafer) include SUS and graphite. SUS is used in a form of an inner wall of a chamber of a monocrystalline silicon pull-up device and a vapor growth apparatus, major parts of monocrystalline silicon slicer and silicon wafer polisher, and the like. Graphite is used in a form of hot-zone components of the monocrystalline silicon pull-up device, a susceptor of a vapor growth apparatus, and the like.

In the above applications, graphite is subjected to a high temperature of approximately 1400 degrees Kelvin. However, the measurement unit 2 of the thermal conductivity estimation apparatus 1, whose measurable temperature range is limited to 90 degrees or more and 110 degrees C. or less, cannot conduct a measurement at 1400 degrees Kelvin. Thus, a study on possible substitution materials is made. The thermal conductivity of graphite at 1400 degrees Kelvin is estimated to be approximately 50 W/mK. Accordingly, in Experiment 2, aluminum bronze is selected as a material having thermal conductivity close to that of graphite (1400 degrees Kelvin) and relatively easily available in a form of a molded article. Further, SUS is selected as an example of the component per se of the production apparatus of monocrystalline silicon and silicon wafer.

Comparative 1

Initially, a thermal conductivity measurement machine (manufactured by ULVAC, Inc., Model No. TC7000) for measuring the thermal conductivity by laser flashing was prepared.

Next, a disc-shaped aluminum bronze sample of 10 mm diameter and 2 mm thick was prepared and the thermal conductivity of the sample was measured using the thermal conductivity measurement machine.

Comparative 2

An SUS sample of the same shape as Comparative 1 was prepared and the thermal conductivity of the sample was measured under the same conditions as those in Comparative 1.

Example 1

A measurement unit 2 having the structure shown in Table 1 and a cylindrical aluminum bronze measurement sample of 20 mm diameter and 70 mm height were prepared. The measurement sample was heated so that the bottom surface temperature became 100 degrees C. Then, the surface temperature distribution at this time was measured using the measurement unit 2. The measurement results were inputted into the regression model made in Experiment 1 to estimate the thermal conductivity.

Example 2

An SUS sample of the same shape as Example 1 was prepared and the thermal conductivity of the measurement sample was estimated under the same conditions as those in Example 1.

Evaluation

Actual measurements of Comparatives 1, 2 and estimated values of Examples 1, 2 are shown in Table 2.

As shown in Table 2, the estimation error ((actual measurements−estimated value)/actual measurements) were approximately 10% in both of aluminum bronze and SUS. It was confirmed that the regression model of the invention could estimate the thermal conductivity with high accuracy on the basis of the temperature distribution measurement result of the measurement sample.

TABLE 2

| Material | Thermal Conductivity (W/mK) | | Estimated Error ((B − A)/A) |
|---|---|---|---|
| | Actual Measurements (A) (Laser Flashing) | Estimated Value (B) | |
| Al-Bronze | 61 (Comparative 1) | 67.59 (Example 1) | 10.80% |
| SUS | 22 (Comparative 2) | 24.50 (Example 2) | 11.36% |

The invention claimed is:

1. A thermal conductivity estimation method comprising:
preparing, as a measurement sample, a component of a production apparatus for a semiconductor crystal product;
heating a part of the measurement sample under a predetermined heating condition and measuring a temperature distribution of a surface of the measurement sample under a steady state;
performing a heat-transfer simulation for a plurality of combinations of provisional thermal conductivities and heating conditions of a sample model of the same shape as the measurement sample to calculate a temperature distribution of the surface of the sample model for each of the plurality of combinations;
making a regression model using a machine learning technique on a basis of training data, the training data being defined by the plurality of combinations used in the heat-transfer simulation and a calculation result of the temperature distribution obtained from the plurality of combinations, an input of the regression model comprised of the temperature distribution of the surface of the measurement sample, an output of the regression model comprised of the thermal conductivity of the measurement sample; and
estimating the thermal conductivity of the measurement sample by inputting a result of the measurement of the temperature distribution of the surface of the measurement sample into the regression model.

2. The thermal conductivity estimation method according to claim 1, wherein
in making the regression model through the machine learning technique, the input of the regression model is defined by the temperature distribution of the surface of the measurement sample and a heating condition in measuring the temperature distribution, and
in estimating the thermal conductivity, the result of the measurement of the temperature distribution and the heating condition in measuring the temperature distribution are input into the regression model to estimate the thermal conductivity of the measurement sample.

3. The thermal conductivity estimation method according to claim 1, wherein the heat-transfer simulation performed in calculating the temperature distribution of the surface of the sample model assumes the same measurement system as a measurement system used in measuring the temperature distribution.

4. The thermal conductivity estimation method according to claim 1, wherein the heat-transfer simulation performed in calculating the temperature distribution of the surface of the sample model assumes the same atmosphere as an atmosphere in measuring the temperature distribution of the surface of the measurement sample.

5. The thermal conductivity estimation method according to claim 1, wherein the measurement sample is a substitution material of the component.

6. A thermal conductivity estimation apparatus comprising:

a measurement unit configured to heat a part of a component, which is prepared as a measurement sample, of a production apparatus of a semiconductor crystal product under a predetermined heating condition and measure a temperature distribution of a surface of the measurement sample under a steady state;

a calculation unit configured to perform a heat-transfer simulation for a plurality of combinations of provisional thermal conductivities and heating conditions of a sample model of the same shape as the measurement sample to calculate a temperature distribution of the surface of the sample model for each of the plurality of combinations;

a machine learning unit configured to make a regression model using a machine learning technique on a basis of training data, the training data being defined by the plurality of combinations used in the heat-transfer simulation and a calculation result of the temperature distribution obtained from the plurality of combinations, an input of the regression model comprised of the temperature distribution of the surface of the measurement sample, an output of the regression model comprised of the thermal conductivity of the measurement sample; and an estimation unit configured to input a result of the measurement of the temperature distribution of the surface of the measurement sample into the regression model to estimate the thermal conductivity of the measurement sample.

7. The thermal conductivity estimation apparatus according to claim 6, wherein the input of the regression model made by the machine learning unit comprises the temperature distribution of the surface of the measurement sample and a heating condition in measuring the temperature distribution, and the estimation unit is configured to input the result of the measurement of the temperature distribution and the heating condition in measuring the temperature distribution into the regression model to estimate the thermal conductivity of the measurement sample.

8. The thermal conductivity estimation apparatus according to claim 6, wherein the heat-transfer simulation performed by the calculation unit assumes the same measurement system as a measurement system used in measuring the temperature distribution of the surface of the measurement sample.

9. The thermal conductivity estimation apparatus according to claim 6, wherein the heat-transfer simulation performed by the calculation unit assumes the same atmosphere as an atmosphere in measuring the temperature distribution of the surface of the measurement sample.

10. The thermal conductivity estimation apparatus according to claim 9, wherein the measurement unit comprises a measurement case that houses the measurement sample.

11. The thermal conductivity estimation apparatus according to claim 10, wherein the measurement unit comprises a temperature holder configured to keep a temperature of the measurement case at a constant temperature.

12. The thermal conductivity estimation apparatus according to claim 10, wherein the measurement unit comprises an inert gas introduction unit configured to introduce an inert gas into the measurement case.

13. The thermal conductivity estimation apparatus according to claim 6, wherein the measurement unit comprises a heater configured to heat the measurement sample, and a heat-transfer reduction unit configured to restrain a heat of the heater from being transferred to the surface of the measurement sample through an atmosphere.

14. A method of producing a semiconductor crystal product, the method comprising:

preparing, as a measurement sample, a component of a production apparatus of the semiconductor crystal product;

estimating the thermal conductivity of the component using the thermal conductivity estimation method according to claim 1;

performing the heat-transfer simulation in a production step of the semiconductor crystal product using a result of the estimation of the thermal conductivity; and controlling a production apparatus of the semiconductor crystal product on a basis of a result of the heat-transfer simulation in the production step to produce the semiconductor crystal product.

15. A method of producing a semiconductor crystal product, the method comprising:

preparing, as a measurement sample, a component of a production apparatus of the semiconductor crystal product;

estimating the thermal conductivity of the component using the thermal conductivity estimation apparatus according to claim 6;

performing the heat-transfer simulation in a production step of the semiconductor crystal product using a result of the estimation of the thermal conductivity; and controlling a production apparatus of the semiconductor crystal product on a basis of a result of the heat-transfer simulation in the production step to produce the semiconductor crystal product.

\* \* \* \* \*